US012604684B2

(12) United States Patent
Shiba et al.

(10) Patent No.: US 12,604,684 B2
(45) Date of Patent: Apr. 14, 2026

(54) METHOD AND SYSTEM FOR MITIGATING UNDERLAYER DAMAGE DURING FORMATION OF PATTERNED STRUCTURES

(71) Applicant: ASM IP Holding B.V., Almere (NL)

(72) Inventors: Eiichiro Shiba, Hachioji (JP); Tomomi Takayama, Tokyo (JP); Che Chen Hsu, Tama (JP)

(73) Assignee: ASM IP Holding B.V., Almere (NL)

( * ) Notice: Subject to any disclaimer, the term of this patent is extended or adjusted under 35 U.S.C. 154(b) by 583 days.

(21) Appl. No.: 17/711,998

(22) Filed: Apr. 1, 2022

(65) Prior Publication Data

US 2022/0319833 A1 Oct. 6, 2022

Related U.S. Application Data

(60) Provisional application No. 63/171,244, filed on Apr. 6, 2021.

(51) Int. Cl.
| | |
|---|---|
| *H01L 21/02* | (2006.01) |
| *C23C 16/34* | (2006.01) |
| *C23C 16/455* | (2006.01) |
| *H01J 37/32* | (2006.01) |

(52) U.S. Cl.
CPC ........ *H01L 21/0228* (2013.01); *C23C 16/345* (2013.01); *C23C 16/45536* (2013.01); *C23C 16/45553* (2013.01); *H01J 37/32449* (2013.01); *H01L 21/02211* (2013.01); *H01L 21/02274* (2013.01); *H01J 2237/3321* (2013.01)

(58) Field of Classification Search
None
See application file for complete search history.

(56) References Cited

U.S. PATENT DOCUMENTS

| | | | |
|---|---|---|---|
| 6,255,221 | B1 | 7/2001 | Hudson |
| 9,564,309 | B2 | 2/2017 | Niskanen |
| 9,576,792 | B2 | 2/2017 | Chen |
| 9,637,823 | B2 | 5/2017 | Knoops |
| 9,824,881 | B2 | 11/2017 | Niskanen |
| 9,905,416 | B2 | 2/2018 | Niskanen |
| 10,072,337 | B2 | 9/2018 | Knoops |
| 10,395,917 | B2 | 8/2019 | Niskanen |
| 10,424,477 | B2 | 9/2019 | Niskanen |

(Continued)

FOREIGN PATENT DOCUMENTS

JP 2013196822 A 9/2013

*Primary Examiner* — Sue A Purvis
*Assistant Examiner* — Seyon Ali-Simah Punchbeddell
(74) *Attorney, Agent, or Firm* — Snell & Wilmer L.L.P.

(57) ABSTRACT

Methods of forming structures suitable for a multiple patterning process are disclosed. Exemplary methods include forming a material overlying the substrate by providing a silicon precursor to the reaction chamber for a silicon precursor pulse period providing one or more of a nitrogen reactant and an oxygen reactant to the reaction chamber for a reactant pulse period, providing an inert gas to the reaction chamber for an inert gas pulse period, and providing a plasma power to form a plasma within the reaction chamber for a plasma pulse period. The inert gas can be provided during the plasma period and/or the plasma power can be pulsed to mitigate any damage to an underlying layer, while providing desired properties of the material layer.

20 Claims, 7 Drawing Sheets

(56)          References Cited

U.S. PATENT DOCUMENTS

| | | | |
|---|---|---|---|
| 10,480,078 | B2 | 11/2019 | Knoops |
| 10,822,700 | B2 | 11/2020 | Knoops |
| 11,069,522 | B2 | 7/2021 | Niskanen |
| 2007/0298585 | A1* | 12/2007 | Lubomirsky ..... H01L 21/76229 |
| | | | 257/E21.548 |
| 2017/0303382 | A1 | 10/2017 | Smith |
| 2017/0323803 | A1* | 11/2017 | van Schravendijk ........................ |
| | | | H01J 37/32009 |
| 2018/0223429 | A1* | 8/2018 | Fukazawa ......... C23C 16/45565 |
| 2018/0277338 | A1 | 9/2018 | Fukada |
| 2018/0308695 | A1* | 10/2018 | LaVoie ............... H01L 21/0338 |
| 2020/0013611 | A1 | 1/2020 | Niskanen |
| 2021/0025059 | A1 | 1/2021 | Knoops |
| 2022/0238325 | A1* | 7/2022 | Agnew ............. H01L 21/02274 |

* cited by examiner

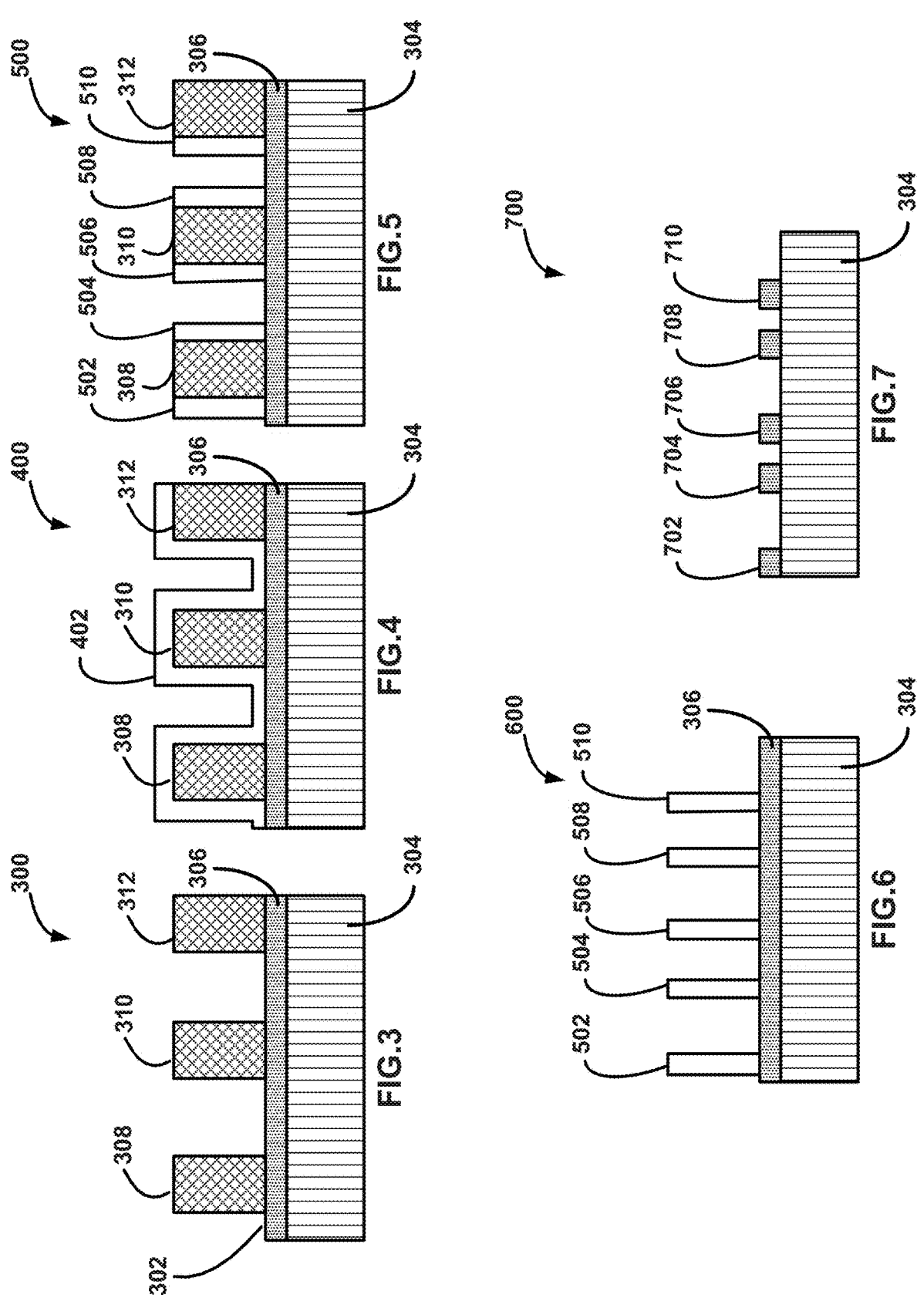

METHOD AND SYSTEM FOR MITIGATING UNDERLAYER DAMAGE DURING FORMATION OF PATTERNED STRUCTURES

CROSS-REFERENCE TO RELATED APPLICATIONS

This application claims the benefit of U.S. Provisional Application No. 63/171,244, filed on Apr. 6, 2021, in the United States Patent and Trademark Office, the disclosure of which is incorporated herein in its entirety by reference.

FIELD OF INVENTION

The present disclosure generally relates to methods and systems for forming structures suitable for forming electronic devices. More particularly, examples of the disclosure relate to methods and systems for forming layers comprising silicon nitride.

BACKGROUND OF THE DISCLOSURE

During the manufacture of electronic devices, fine patterns of features can be formed on a surface of a substrate by patterning the surface of the substrate and removing material from the substrate surface using, for example, wet etch and/or dry etch processes. Photoresist is often used as a template for such patterning of a surface of a substrate.

A photoresist pattern can be formed by coating a layer of photoresist onto a surface of the substrate, masking the surface of the photoresist, exposing the unmasked portions of the photoresist to radiation, such as ultraviolet light or an electron beam, and removing a portion (e.g., the unmasked or masked portion) of the photoresist, while leaving a portion (e.g., the other of the unmasked or masked portion) of the photoresist on the substrate surface. Once the photoresist is patterned, the patterned photoresist can be used as a template for etching material on the substrate surface in regions in which the photoresist was removed to form a transferred pattern in a layer underlying the photoresist. After etching, remaining photoresist can be removed.

As a size of devices decreases, traditional photoresist techniques may not be suitable to form patterns of desired size. In such cases, (e.g., extreme ultraviolet (EUV)) multiple patterning techniques can be used to allow for patterning and etching of features that can be smaller than the exposure resolution of the photolithography process. A multiple patterning process can include forming a spacer about patterned features (e.g., patterned photoresist), removing the patterned features to form patterned structures, and using the patterned structures as a mask during a subsequent etch.

Although such techniques may work relatively well in some applications, some multiple-patterning processes, such as EUV-based multiple patterning processing, can result in undesired plasma damage to an underlayer. This phenomenon generally becomes increasingly problematic as the size of the patterned structures decreases.

Techniques to address the underlayer damage include using lower RF power during deposition of a spacer layer. However, such techniques can result in low plasma reactivity and/or plasma ignition failures. Other attempts to address unwanted damage to the underlayer have resulted in spacer film with degraded film properties (e.g., lower etch selectivity).

Accordingly, improved methods of forming patterned structures on a surface of a substrate, while mitigating unwanted damage to an underlayer, are desired. Further, device structures, which include such patterned structures, are also desired. And, systems for performing the method are also desired.

Any discussion of problems and solutions set forth in this section has been included in this disclosure solely for the purpose of providing a context for the present disclosure, and should not be taken as an admission that any or all of the discussion was known at the time the invention was made.

SUMMARY OF THE DISCLOSURE

Various embodiments of the present disclosure relate to methods of forming patterned structures on a surface of a substrate and to systems for forming the patterned structures. The patterned structures can be used in the formation of devices, such as semiconductor devices and other electronic devices.

While the ways in which various embodiments of the present disclosure address drawbacks of prior methods and systems are discussed in more detail below, in general, various embodiments of the disclosure provide improved methods of forming patterned structures while mitigating damage to an underlayer and maintaining a quality of a deposited (e.g., spacer) layer. As set forth in more detail below, examples of the disclosure include use of a reduced plasma power and use of an inert gas to form and maintain the plasma. Use of the inert gas can increase reactivity of species formed via the plasma—even at a reduced plasma power. Further examples of the disclosure include use of pulsed plasma power to facilitate maintaining a quality of the deposited material and/or mitigating damage to the underlayer.

In accordance with examples of the disclosure, a method of forming a structure is disclosed. The method can be used for forming electronic devices, using, for example, multiple patterning (e.g., spacer-defined double patterning) techniques. An exemplary method includes providing a substrate within a reaction chamber, and depositing a material layer by providing a silicon precursor to the reaction chamber for a silicon precursor pulse, providing one or more of a nitrogen reactant and an oxygen reactant to the reaction chamber for a reactant pulse (which can be continuous through one or more deposition cycles), providing an inert gas to the reaction chamber for an inert gas pulse, and forming a plasma for a plasma period using the inert gas to thereby deposit the material layer on a surface of the substrate. In accordance with examples of the disclosure, the substrate includes patterned (e.g., carbon and/or sacrificial) features, and the silicon nitride and/or silicon oxide is deposited overlying the patterned sacrificial features. In accordance with examples of the exemplary method, the inert gas pulse and the step of forming the plasma overlap in the reaction chamber. In accordance with further examples, a power during the step of forming the plasma is less than 800 W, less than 500 W, or less than 400 W. In accordance with yet further examples, plasma power is pulsed during the plasma period. As explained in more detail below, to mitigate disruption to a plasma, a (e.g., volumetric) flowrate of the one or more of the nitrogen reactant and the oxygen reactant and a flowrate of the inert gas during the step of forming the plasma can be about the same (e.g., within about ±10 percent, ±5 percent, or ±2 percent). In accordance with further examples, a carrier gas and/or reactant flowrate to the reaction chamber can be reduced when the inert gas is provided to the reaction chamber, e.g., such that a total flowrate of gas to the reaction chamber remains about constant. In some cases, the carrier gas flowrate can be constant through one or more deposition cycles and the (e.g., nitrogen and/or oxygen) reactant flowrate can be reduced when the inert gas is provided to the reaction chamber. Alternatively, the (e.g., nitrogen and/or oxygen) reactant flowrate can be constant through one or more deposition cycles and the carrier gas flowrate can be reduced when the inert gas is provided to the reaction chamber.

In accordance with further examples of the disclosure, the method can further comprise a step of (e.g., using reactive ion etching) removing a portion of the material layer. Additionally or alternatively, the method can include a step of removing remaining portions of sacrificial features to thereby form patterned structures. Additionally or alternatively, the method can include a step of etching a portion of the substrate using the patterned structures.

In accordance with further embodiments of the disclosure, a device structure is provided. The device structure can be formed according to a method as set forth herein. The device structure can include a substrate and one or more patterned structures formed thereon or therein.

In accordance with yet additional examples of the disclosure, a system configured to perform a method and/or form a device structure as described herein is provided.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIGS. 3-7 illustrate device structures in accordance with exemplary embodiments of the disclosure.

Figure 1:
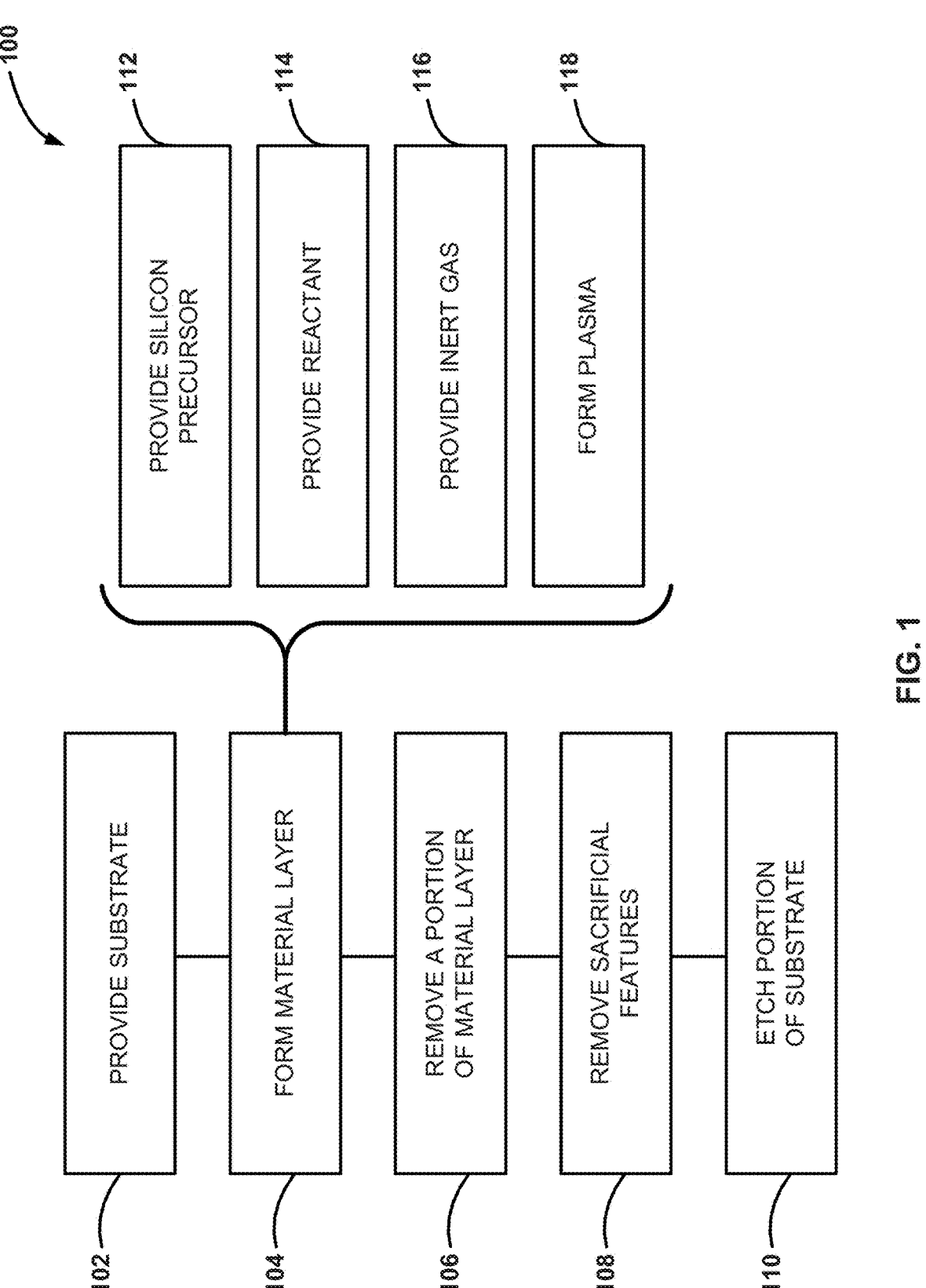
FIG. 1 illustrates a method in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming a structure, to device structures including or formed using the structure or the method, and to systems for performing the methods and/or forming the device structures. As described in more detail below, exemplary methods can be used to form device structures suitable for forming electronic devices. For example, exemplary methods can be used to form patterned structures on a surface of a substrate. The patterned structures can be used as an etch mask or as patterned features for formation of a next set of patterned structures. As further set forth in more detail below, exemplary methods and systems can mitigate damage to an underlayer that might otherwise occur during depositing of a material layer, while maintaining desired properties (e.g., density, etch selectivity with regard to an underlayer material, and the like) of the deposited material.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. The terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include bulk semiconductor material and/or a layer to be etched, and patterned sacrificial features formed thereon.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments. For example, a reactant can be supplied continuously during two or more steps and/or deposition cycles of a method.

The term cyclic deposition process or cyclical deposition process or cyclic deposition cycle can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

As used herein, the term atomic layer deposition (ALD) may refer to a vapor deposition process in which deposition cycles, preferably a plurality of consecutive or continuous deposition cycles, are conducted in a process chamber. Typically, during each cycle, a precursor is introduced and may be chemisorbed to a deposition surface (e.g., a substrate surface or a previously deposited underlying surface, such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PEALD refers to an ALD process, in which a plasma is applied during one or more of the ALD steps or substeps.

As used herein, the term purge may refer to a procedure in which an inert or substantially inert gas is provided to a reactor chamber in between two pulses of gases which react with each other. For example, a purge may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reactor chamber, providing a purge gas to the reactor chamber, and providing a reactant to the reactor chamber, wherein the substrate on which a layer is deposited does not move. For example, in the case of spatial purges, a purge step can take the following form: moving a substrate from a first location to which a first precursor is supplied, through a purge gas curtain, to a second location to which a reactant is supplied.

As used herein, silicon oxide refers to a material that includes silicon and oxygen. Silicon oxide can be represented by the formula $SiO_2$. In some cases, the silicon oxide may not include stoichiometric silicon oxide. In some cases, the silicon oxide can include other elements, such as carbon, nitrogen, hydrogen, or the like.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, oxygen, hydrogen, or the like.

As used herein, the term overlap can mean coinciding with respect to time and within a reaction chamber. For example, with regard to gas pulse periods, such as precursor pulse periods and reactant pulse periods, two or more gas pulse periods can overlap when gases from the respective pulse periods are within the reaction chamber or provided to the reaction chamber for a period of time.

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms include, including, constituted by and having can refer independently to typically or broadly comprising, consisting essentially of, or consisting of in some embodiments. In this disclosure, any defined meanings do not necessarily exclude ordinary and customary meanings in some embodiments.

Turning now to the figures, FIG. 1 illustrates an exemplary method 100 of forming a structure. Method 100 is suitable for forming patterned structures on a surface of a substrate, which can be used in, e.g., a multiple patterning process. Method 100 includes the steps of providing a substrate within a reaction chamber (step 102) and forming a material layer overlying the substrate (step 104). Method 100 can also include the steps of removing a portion of the material layer (step 106), removing sacrificial features (step 108), and etching a portion of the substrate (step 110). Although illustrated with steps 102-110, exemplary methods need not include all such steps, but rather, unless noted otherwise, can include any subset of the steps.

During step 102, a substrate (e.g., comprising a surface comprising patterned features) is provided within a reaction chamber of a reactor system. An exemplary substrate 300 for use during step 102 is illustrated in FIG. 3. In this example, the substrate (a device structure) includes a first layer or bulk material 304, a second layer 306 (e.g., a layer to be etched), and a surface 302, including sacrificial features 308-312. First layer or bulk material 304 can include, for example, silicon or other semiconductor material; second layer 306 can include, for example, one or more materials having etching selectivity against materials used to form features 308-312 and layer 402. Sacrificial features 308-312 can include, for example, one or more of photoresist, carbon hardmask material, amorphous silicon, or polysilicon.

Returning again to FIG. 1, a reaction chamber used during step 102 can be or include a reaction chamber of a chemical vapor deposition reactor system configured to perform a cyclical deposition process, and particularly, a plasma-enhanced cyclical deposition process. The reaction chamber can be a standalone reaction chamber or part of a cluster tool.

Step 102 can include heating the substrate to a desired deposition temperature within the reaction chamber. In some embodiments of the disclosure, step 102 includes heating the substrate to a temperature of less than 800° C. or less than 500° C. For example, in some embodiments of the disclosure, heating the substrate to a deposition temperature may comprise heating the substrate to a temperature between approximately 75° C. and approximately 350° C. or between about 250° C. and about 300° C. In addition to controlling the temperature of the substrate, a pressure within the reaction chamber may also be regulated. For example, in some embodiments of the disclosure, the pressure within the reaction chamber during step 102 may be less than 760 Torr or between about 1500 Pa and about 3000 Pa or between about 10 Pa and about 13333 Pa.

During step 104, a material layer (e.g., material layer 402, illustrated in FIG. 4) is formed overlying the substrate provided in step 102. Material layer 402 can be or include, for example, a nitride or an oxide, such as a silicon oxide or a silicon nitride. In accordance with examples of the disclosure, layer 402 can be relatively thin, e.g., less than 15 nm or less than 20 nm, because of the desirable properties of layer 402. In particular, material layer 402 can exhibit a high etch selectivity, compared to, for example, layer 306 materials.

Step 104 can include providing a precursor (e.g., silicon precursor) to the reaction chamber for a precursor pulse period (112), providing a (e.g., nitrogen and/or oxygen) reactant to the reaction chamber for a reactant pulse period (114), providing an inert gas to the reaction chamber for an inert gas pulse period (116), and applying a plasma power for a plasma period (118). The pressure and/or temperature during step 104 can be the same or similar to or within the range of the temperature and pressure set forth in connection with step 102.

As used herein, pulse period means a period in which a gas (e.g., precursor, reactant, inert gas, and/or carrier gas) is flowed to a reaction chamber and/or a period in which power is applied (e.g., power to produce a plasma). In some cases a pulse period can be continuous through one or more deposition cycles. In some cases, a continuous pulse can include continuously providing a gas to the reaction chamber; a flowrate of the gas during a continuous pulse can change. A height and/or width of the illustrated pulse period is not necessarily indicative of a particular amount or duration of a pulse.

Figure 2:
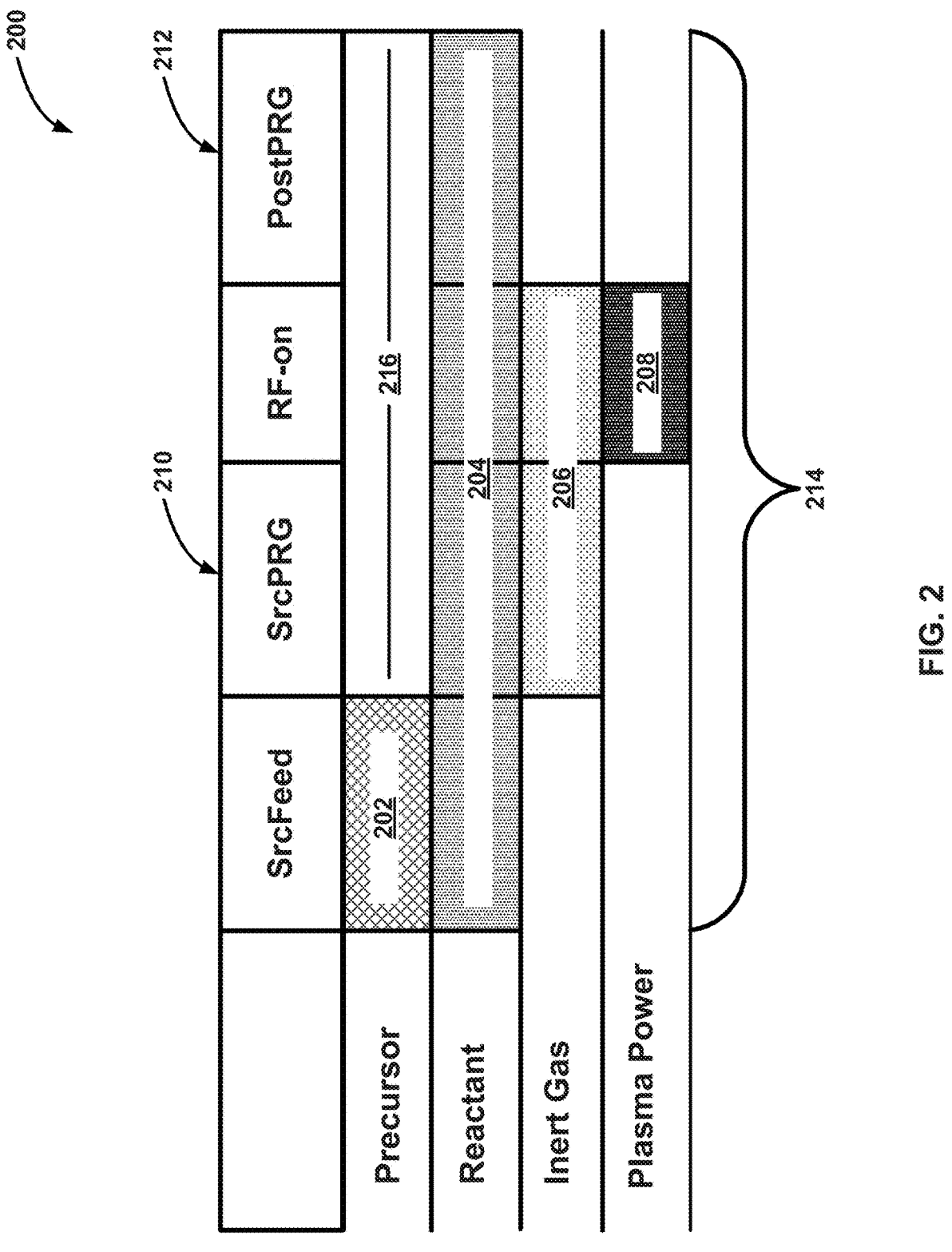
FIG. 2 illustrates a timing sequence in accordance with examples of the disclosure.

FIG. 2 illustrates an exemplary timing sequence 200 suitable for step 104 of forming a material layer overlying the substrate. In the illustrated example, a precursor is provided to the reaction chamber for a precursor pulse period 202, a reactant is provided to the reaction chamber for a reactant pulse period 204, an inert gas is provided to the reaction chamber for an inert gas pulse period 206, and a plasma power is applied to form a plasma during plasma period 208. As illustrated, sequence 200 can include one or more deposition cycles 214; each deposition cycle can include a precursor pulse period 202, a reactant pulse period 204, an inert gas pulse period 206, and a plasma period 208. In the illustrated case, deposition cycle 214 comprises a cyclical deposition process, such as a plasma-enhanced ALD process. The temperatures and/or pressures noted above can desirably be stabilized prior to one or more deposition cycles 214 and/or substeps thereof.

Sequence 200 can also include a carrier gas pulse period 216. During carrier gas pulse period 216, a carrier gas (e.g., used to facilitate providing a precursor), such as one or more of argon, helium, alone or in any combination, is provided to the reaction chamber. A flowrate of the carrier gas can be between about 500 and about 5000 sccm. Carrier gas pulse period 216 can overlap with precursor pulse period 202. Further, a flowrate of carrier gas during carrier gas pulse period 216 (and/or a flowrate of reactant gas during reactant pulse period 204) can be reduced during an overlap with inert gas pulse period 206

In the illustrated example, (e.g., silicon) precursor pulse period 202 ceases prior to plasma period 208. Reactant pulse period 204 and a carrier gas pulse period 216 can be continuous through one or more deposition cycles 214. As noted herein, during a continuous pulse period, a flowrate of the reactant and/or carrier gas can change—e.g., such that a total (e.g., volumetric) flowrate of gas to the reaction chamber remains about during an overlap of pulse periods 216, 204, and 206.

Exemplary precursors suitable for use with precursor pulse period 202 comprise one or more silicon precursors. Exemplary silicon precursors can be selected from the group consisting of aminosilane, halogenated silane, monosilane, disilane, and an organosilane as a precursor. The aminosilanes can include, but are not limited to, bisdiethylaminosilane, bisdimethylaminosilane, hexaethylaminodisilane, tetraethylaminosilane, tert-butylaminosilane, bistert-butylaminosilane, trimethylsilyldiethylamine, trimethylsilyldiethylamine, and bisdimethylaminodimethylsilane. The halogensilane can include, for example, one or more of dichlorosilane, diiodosilane, hexachlorodisilane, octachlorotrisilane, dibromosilane, tribromosilane, trichlorosilane ($HSiCl_3$), chlorosilane ($H_3SiCl$), silicon tetrachloride ($SiCl_4$), bromosilane ($H_3SiBr$), triiodosilane ($HSil_3$), iodosilane ($H_3SiI$), diiiodosilane ($H_2Si_2I4$), $H4Si_2I_2$, and $H_5Si_2I$. The organosilane can include one or more of an aminosilane and a heterosilane. By way of particular example, the silicon precursor can include one or more of tris(dimethylamino)silane, bis(tert-butylamino)silane, di(sec-butylamino)silane, trisilyla mine, neopentasilane, bis (dimethylamino)silane, (dimethylamino)silane (DMAS), bis (diethylamino)silane (BDEAS), bis(ethylmethylamino)silane (BEMAS), tetrakis(dimethylamino)silane (TKDMAS), trimethylsilane ($SiH(CH_3)_3$), tetramethylsilane ($Si(Ch_3)_4$), silane, tetra(ethoxy)silane (TEOS, $Si(OC_2H_5)_4$), tris(tert-butoxy)silanol (TBOS), tris(tert-pentoxy)silanol (TPSOL), and dimethyldichlorosilane ($Si(OC_2H_5)_4$, $Si(CH_3)_2$ $(OCH_3)_2$).

A precursor with a carrier gas flowrate may be in a range of about 500 to about 5000 sccm. A duration of precursor pulse period 202 can range from about 0.05 to about 5 seconds. A flowrate of the one or more of the nitrogen reactant and the oxygen reactant can be reduced during the step of forming the plasma 118 for the plasma period, relative to a flowrate of the one or more of the nitrogen reactant and the oxygen reactant prior to the step of forming the plasma.

During step 114, a reactant is provided to the reaction chamber (e.g., for reactant pulse period 204). Exemplary reactants suitable for use with reactant pulse period 204 include one or more of oxygen and nitrogen, alone or in any combination with or without an inert gas. Exemplary suitable nitrogen reactants include one or more of nitrogen ($N_2$), $N_2O$, and NO. Exemplary suitable oxygen reactants include one or more of $O_2$, $CO_2$, CO, $N_2O$ and NO. A reactant flowrate may be in a range of about 100 to about 10000 sccm. As illustrated, reactant pulse period 204 can be continuous through one or more deposition cycles 214.

During step 116 of providing an inert gas to the reaction chamber for an inert gas pulse period (e.g., pulse period 206), an inert gas is provided to the reaction chamber. Exemplary inert gases suitable for step 116/pulse 206 include helium, neon, xenon, alone or in any combination. In the illustrated example, inert gas pulse period 206 begins prior to plasma period 208 and overlaps with plasma period 208. In the illustrated example, inert gas pulse period 206 and plasma period 208 end at about the same time. The flow of the inert gas increases the plasma activity for a given power level and facilitates ignition and maintaining a plasma at a lower power level, which in turn produces less damage to layer 306 during deposition of layer 402.

An inert gas flowrate can be in a range of about 1000 to about 10000 sccm. A duration of step 116/inert gas pulse period 206 can range from about 0.1 to about 2.0 seconds or about 0.01 to about 10 seconds.

During forming a plasma step 118/plasma period 208, a power suitable to produce a plasma is provided. The plasma may be a direct plasma—formed within the reaction chamber. In accordance with examples of the disclosure, power provided during plasma period 208 has a frequency between about 13 MHz and about 14 MHz or about 26 MHz and about 28 MHz. The power applied during first plasma period 208 can be greater than zero and less than 800 W, less than 500 W, or less than 400 W (e.g., for a 300 mm substrate) or similar power density (per surface area of a substrate) and/or greater than 50 W for a 300 mm substrate or similar power density.

In some cases, the power supplied during step 118/plasma period 208 is pulsed. A pulse period of the plasma power can be greater than 0 and less than 100 microseconds or less than an (e.g., average) ion lifetime for ions created during step 118/plasma period 208.

Figure 8:
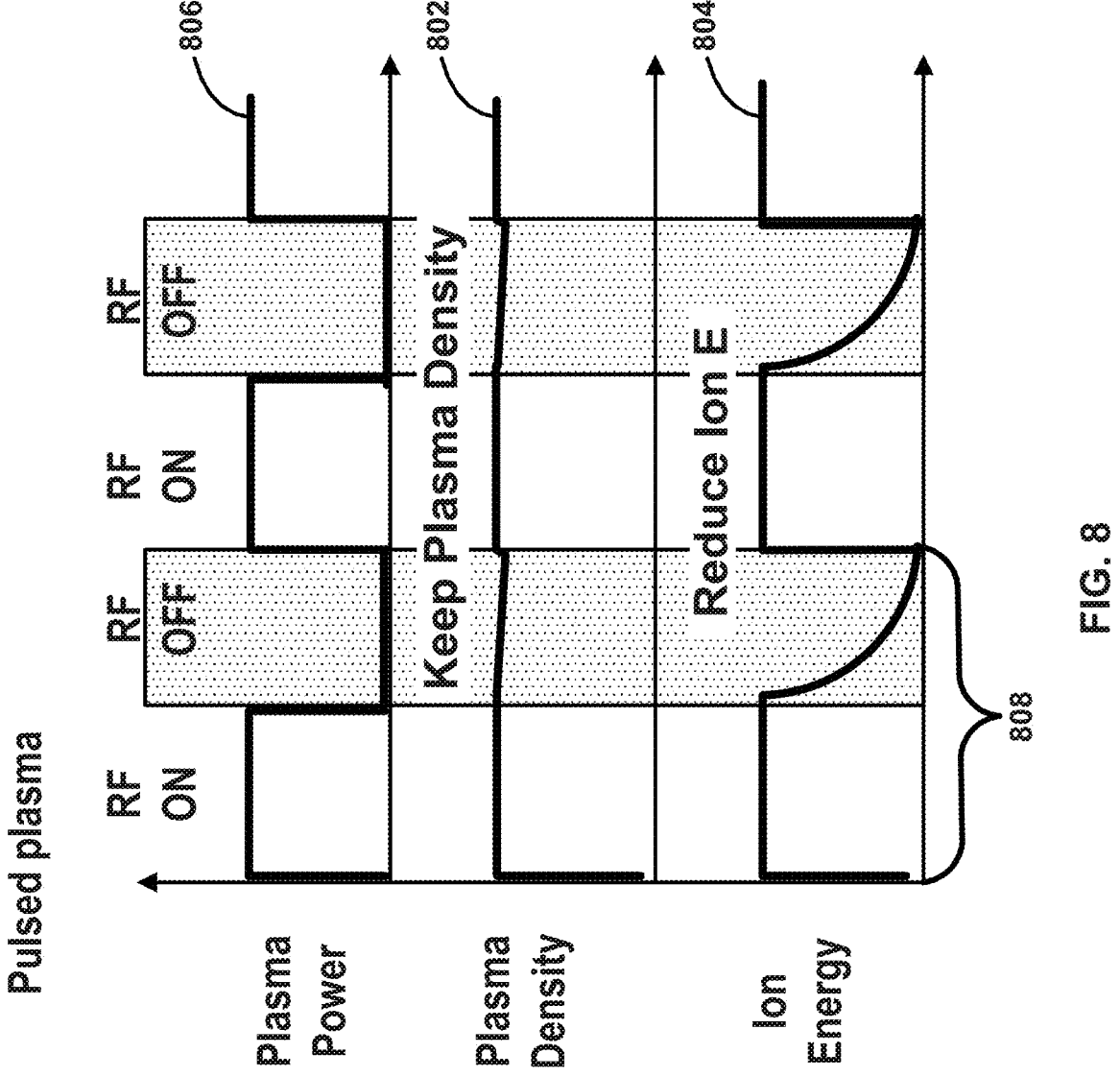
FIG. 8 illustrates plasma density and ion energy for a plasma formed using pulsed plasma power in accordance with further examples of the disclosure.

FIG. 8 illustrates plasma density 802 and ion energy 804 for a pulse plasma power 806 in accordance with examples of the disclosure. As illustrated, when a period of power during step 118/plasma period 208 is less than ion lifetime, plasma density 802 can remain relatively constant, while ion energy 804 is allowed to fall during each pulse cycle 808. Thus, damage that might otherwise occur to an underlayer (e.g., layer 306) can be reduced, while maintaining desired plasma density during forming a material layer step 104. And, film quality of the deposited material layer can be maintained.

Timing sequence 100 includes a source purge period 210 and a post-deposition purge period 212. During source purge period 210, pulse periods 204, 206, and 216 can overlap. A duration of source purge period 210 can be between about 0.1 and about 10 second. During post-deposition purge period 212, pulse periods 204 and 206 can overlap. A duration of post-deposition purge period 212 can be between about 0.01 and about 5 sec. second.

Timing sequence 200 can also include a carrier gas pulse period 216 and a seal gas pulse period (not illustrated). During carrier gas pulse period 216, a carrier gas (e.g., used to facilitate providing a precursor), such as one or more of argon, helium, alone or in any combination, is provided to the reaction chamber. A flowrate of the carrier gas can be between about 500 and about 5000 sccm.

During a seal gas pulse period, a seal gas can be introduced into an interior of the reactor to facilitate separation of a reaction zone and a transfer zone within the interior of the reactor. A seal gas pulse period can begin before a deposition cycle and end after the last deposition cycle.

Figure 9:
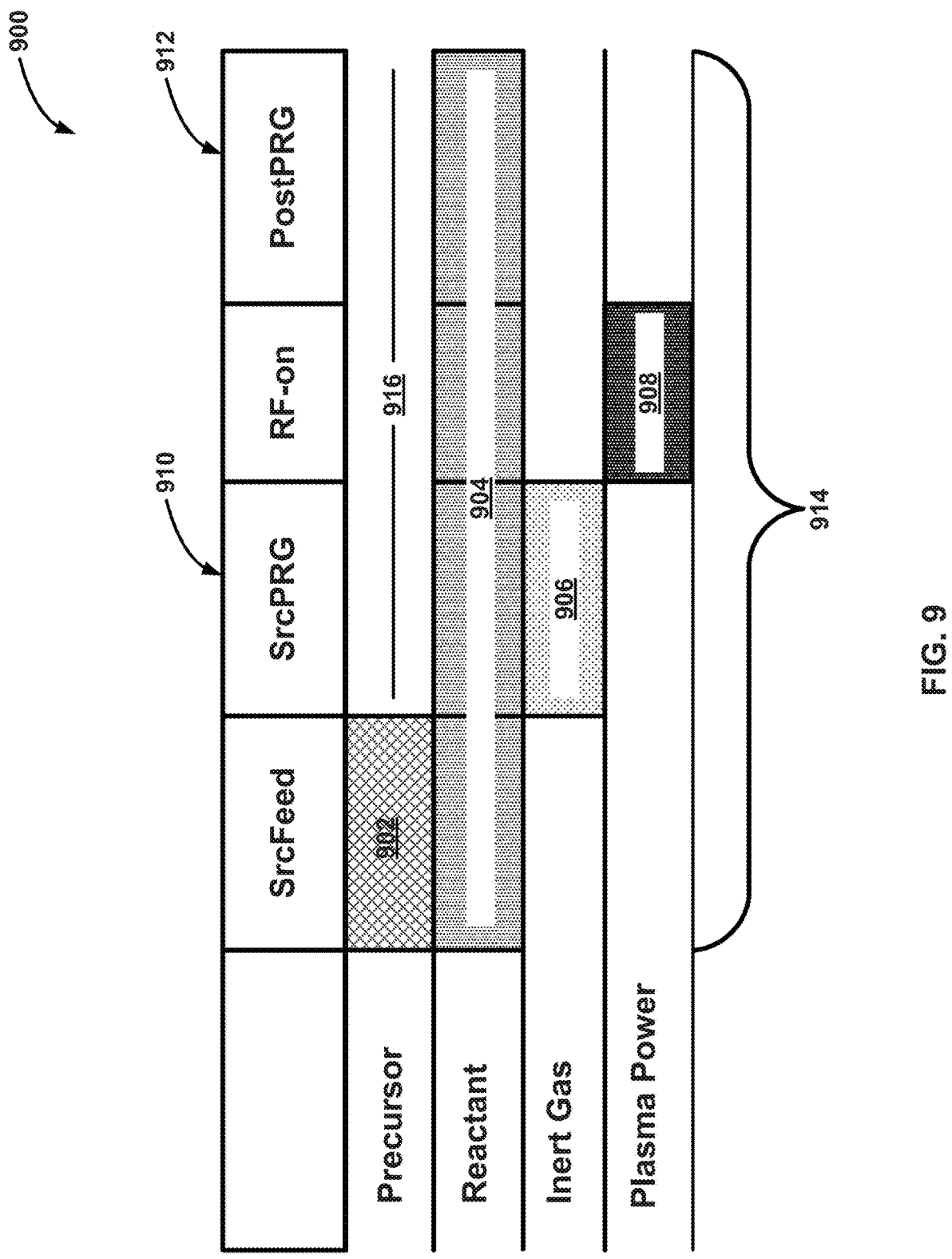
FIG. 9 illustrates another timing sequence in accordance with examples of the disclosure.

FIG. 9 illustrates another timing sequence 900 suitable for use with step 104. Timing sequence 900 includes a precursor pulse period 902, reactant pulse period 904, an inert gas pulse period 906, a plasma period 908, a source purge period 910, a post-deposition purge period 912, and a carrier-gas period 916, which can form a deposition cycle 914. Sequence 900 can be the same as sequence 200, except inert gas pulse period 906 ceases at about the time plasma period 908 begins. In this case, inert gas can be used to ignite a plasma and the inert gas within the reaction chamber can be reduced during plasma period 908.

Data showed that pulse method 100 with a pulsed plasma exhibits comparable coverage to that of a non-pulsed plasma (within 10 percent or within 5 percent), despite a 50% lower total plasma power on time. Specific data measured deposited material (e.g., layer 402) at a midpoint of a sidewall of a feature (e.g., feature 308) and at a top of the feature.

Returning to FIG. 1, once step 104 (e.g., timing sequence 200 or 900) is complete, a portion of the layer 402 can be removed to form device structure 500, including patterned structures 502-510, also referred to as spacers, as illustrated in FIG. 5. A portion of layer 402 can be removed using, for example, a dry etch process (e.g., using activated fluorine). A reactant during the dry etch process can include, for example, $NF_3$ at about 50° C. to about 300° C.

During step 108, patterned (e.g., a plurality of carbon) features 308-312 or any remaining portions thereof can be removed. For example, an aching process can be used to remove patterned features 308-312 to form device structure 600, as illustrated in FIG. 6.

During step 110, layer 306 can be etched using patterned structures 502-508 as a templated mask to form device structure 700, as illustrated in FIG. 7. Device structure 700 includes substrate 304 and patterned structures 702-708 formed thereon. Any suitable etch process can be used to form features 702-708 and will generally depend on the composition of layer 306.

Figure 10:
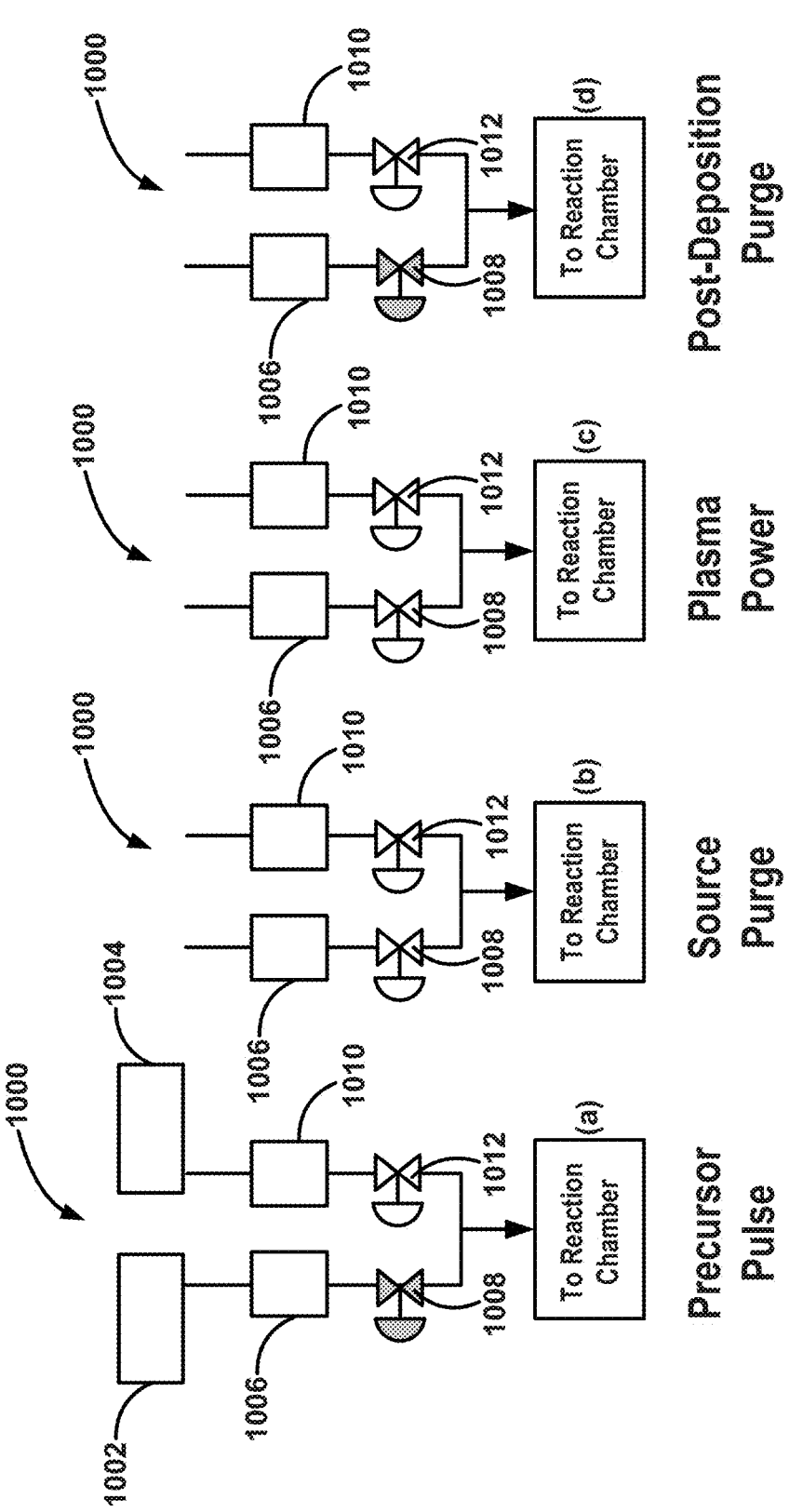
FIG. 10 illustrates a flow control apparatus in accordance with examples of the disclosure.

FIG. 10 illustrates flow control apparatus 1000 suitable for use in accordance with examples of the disclosure. In particular, FIG. 10 illustrates flow control apparatus 1000 for an inert gas from an inert gas source 1002 and a reactant gas and/or carrier gas from a reactant gas source and/or carrier gas source 1004 can be flowed and controlled during (a) a precursor pulse (e.g., precursor pulse period 202, 902), (b) a source purge period (e.g., source purge period 210, 910), (c) a plasma period (e.g., plasma period 208, 908), and (d) a post-deposition purge period (e.g., post-deposition purge period 212, 912). Apparatus 1000 includes an inert gas flow controller 1006, an inert gas valve 1008, reactant (and/or carrier) gas flow controller 1010, and reactant (and/or carrier) gas valve 1012. Inert gas valve 1008 can be between a reaction chamber and inert gas flow controller 1006. Reactant (and/or carrier) gas valve 1012 can be between a reaction chamber and reactant (and/or carrier) gas flow controller 1010. Inert gas flow controller 1006 and/or reactant (and/or carrier) gas flow controller 1010 can be or include, for example, a mass flow controller. To mitigate disruption of a deposition system, a (mass or volumetric) flowrate of the inert gas from inert gas source 1002 and a reactant (and/or carrier) from reactant (and/or carrier) gas source 1004 can be about the same (e.g., within about ±10 percent, ±5 percent, or ±2 percent). In accordance with examples, as inert gas is introduced to the reaction chamber a flowrate of the carrier and/or reactant gas is reduced, such the a total flowrate (volumetric or mass) can remain about the same (e.g., within about ±10 percent, ±5 percent, or ±2 percent).

As illustrated in FIG. 10 (*a*), during a precursor pulse, inert gas valve 1008 can be closed, and reactant (and/or carrier) gas valve 1012 can be open. During a source purge, illustrated in FIG. 10 (*b*), both inert gas valve 1008 and reactant (and/or carrier) gas valve 1012 can be open. During a plasma period, inert gas valve 1008 and reactant (and/or carrier) gas valve 1012 can be open (as illustrated in FIG. 10*c*)) or inert gas valve 1008 can be open and reactant (and/or carrier) gas valve 1012 can be closed. During a post-deposition purge, inert gas valve 1008 can be closed and reactant (and/or carrier) gas valve 1012 can be open.

Figure 11:
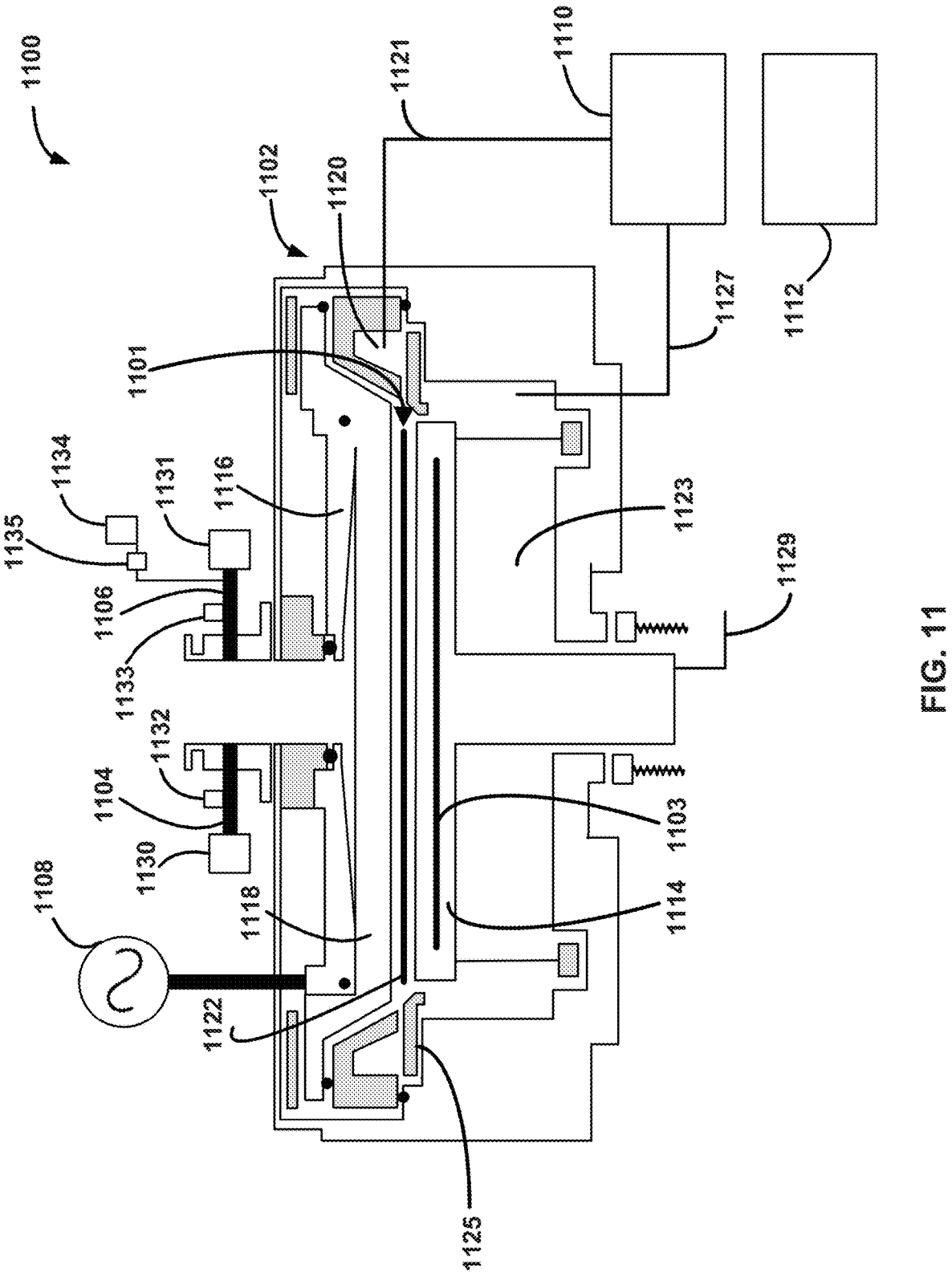
FIG. 11 illustrates a system in accordance with at least one embodiment of the disclosure.

Turning now to FIG. 11, a reactor system 1100 in accordance with exemplary embodiments of the disclosure is illustrated. Reactor system 1100 can be used to perform one or more steps or substeps as described herein and/or to form one or more device structures or portions thereof as described herein.

Reactor system 1100 includes a pair of electrically conductive flat-plate electrodes 1114, 1118 in parallel and facing each other in an interior 1101 (reaction zone) of a reaction chamber 1102. Although illustrated with one reaction chamber 1102, system 1100 can include two or more reaction chambers. A plasma can be excited within reaction chamber 1102 by applying, for example, RF power from plasma power source(s) 1108 to one electrode (e.g., electrode 1118) and electrically grounding the other electrode (e.g., electrode 1114). A temperature regulator 1103 can be provided in a lower stage 1114 (the lower electrode), and a temperature of a substrate 1122 placed thereon can be kept at a desired temperature, such as the temperatures noted above. Electrode 1118 can serve as a gas distribution device, such as a shower plate or showerhead. Precursor gases, reactant gases, and a carrier or inert gas, and the like can be introduced into reaction chamber 1102 using one or more gas lines (e.g., reactant gas line 1104 coupled to a reactant source 1130 (e.g., one or more of an oxygen reactant source and a nitrogen reactant source)) and precursor gas line 1106 coupled to a silicon precursor source 1131 and an inert gas source 1134. For example, an inert gas and a reactant (e.g., as described above) can be introduced into reaction chamber 1102 using line 1104 and/or a precursor and a carrier gas (e.g., as described above) can be introduced into the reaction chamber using line 1106. Although illustrated with two inlet gas lines 1104, 1106, reactor system 1100 can include any suitable number of gas lines. A flow control system including flow controllers 1132, 1133, 1135 can be used to control the flow of one or more reactants, precursors, and inert gases into reaction chamber 1102.

In reaction chamber 1102, a circular duct 1120 with an exhaust line 1121 can be provided, through which gas in the interior 1101 of the reaction chamber 1102 can be exhausted to an exhaust source 1110. Additionally, a transfer chamber 1123 can be provided with a seal gas line 1129 to introduce seal gas into the interior 1101 of reaction chamber 1102 via the interior (transfer zone) of transfer chamber 1123, wherein a separation plate 1125 for separating the reaction zone 1101 and the transfer chamber 1123 can be provided (a gate valve through which a substrate is transferred into or from transfer chamber 1123 is omitted from this figure). Transfer chamber 1123 can also be provided with an exhaust line 1127 coupled to an exhaust source 1110. In some embodiments, continuous flow of a carrier gas to reaction chamber 1102 can be accomplished using a flow-pass system (FPS).

Reactor system 1100 can include one or more controller(s) 1112 programmed or otherwise configured to cause one or more method steps as described herein to be conducted. Controller(s) 1112 are coupled with the various power sources, heating systems, pumps, robotics and gas flow controllers, or valves of the reactor, as will be appreciated by the skilled artisan. By way of example, controller 1112 can be configured to control gas flow of a precursor, a reactant, and an inert gas into at least one of the one or more reaction chambers to form a layer on a surface of a substrate. Controller 1112 can be further configured to provide power—e.g., within reaction chamber 1102. Controller 1112 can be similarly configured to perform additional steps as described herein. By way of examples, controller 1112 can be configured to control gas flow of a precursor, an inert gas, and a reactant into at least one of the one or more reaction chambers to form a silicon nitride layer overlying a substrate.

Controller 1112 can include electronic circuitry and software to selectively operate valves, manifolds, heaters, pumps and other components included in system 1100. Such circuitry and components operate to introduce precursors, reactants, and purge gases from the respective sources. Controller 1112 can control timing of gas pulse sequences, temperature of the substrate and/or reaction chamber, pressure within the reaction chamber, and various other operations to provide proper operation of the system 1100.

Controller 1112 can include control software to electrically or pneumatically control valves to control flow of precursors, reactants, and/or purge gases into and out of the reaction chamber 1102. Controller 1112 can include modules, such as a software or hardware component, e.g., a FPGA or ASIC, which performs certain tasks. A module can advantageously be configured to reside on the addressable storage medium of the control system and be configured to execute one or more processes.

By way of particular examples, controller 1112 is configured to control gas flow of a silicon precursor for a silicon precursor pulse, a nitrogen and/or oxygen reactant for a reactant pulse, and an inert gas for an inert gas pulse into the reaction chamber to form one or more of a silicon nitride layer and a silicon oxide layer on a surface of a substrate. The nitrogen and/or oxygen reactant and the inert gas can be provided to the reaction chamber for the plasma pulse period, and the plasma power can be pulsed during a plasma power period.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 1100, substrates, such as semiconductor wafers, are transferred from, e.g., a substrate handling area 1123 to the reaction zone 1101. Once substrate(s) are transferred to reaction zone 1101, one or more gases, such as precursors, reactants, carrier gases, and/or purge gases, are introduced into reaction chamber 1102.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

The invention claimed is:

1. A method of forming a structure, the method comprising the steps of:

providing a substrate within a reaction chamber; and forming a material layer, wherein the step of forming the material layer comprises:

providing a silicon precursor to the reaction chamber for a silicon precursor pulse period, wherein providing the silicon precursor to the reaction chamber is ceased at an end of the silicon precursor pulse period;

after the silicon pulse period, performing a first purge during a first purge period;

providing one or more of a nitrogen reactant and an oxygen reactant to the reaction chamber during a reactant pulse period;

after the silicon precursor pulse period, providing an inert gas to the reaction chamber for an inert gas pulse period, wherein providing the inert gas is ceased at the end of the inert gas pulse period;

after the purge period, forming a plasma for a plasma period using the inert gas to thereby deposit one or more of silicon nitride and silicon oxide on a surface of the substrate; and after the inert gas pulse period, performing a second purge during a second purge period.

2. The method of claim 1, wherein the inert gas pulse period and the plasma period overlap, and wherein the inert gas pulse period comprises a first period before the plasma period.

3. The method of claim 1, wherein a power during the step of forming the plasma is less than 800 W.

4. The method of claim 1, wherein a plasma power is pulsed during the plasma period, wherein a pulse period of the plasma power is less than 100 microseconds.

5. The method of claim 1, further comprising removing at least a portion of the material layer through a dry etch process comprising providing activated fluorine, wherein the dry etch process comprises providing $NF_3$, and wherein a temperature of the reaction chamber during the dry etch process is between about 50° C. and about 300° C.

6. The method of claim 1, wherein the substrate comprises a plurality of carbon features, wherein the material layer is formed on the carbon features.

7. The method of claim 1, wherein the silicon precursor comprises a silane.

8. The method of claim 7, wherein the silicon precursor comprises one or more of hexachlorodisilane, octachloro-trisilane, and silicon tetrachloride ($SiCl_4$).

9. The method of claim 5, wherein the substrate comprises one or more features, wherein the material layer is formed on the one or more features, and wherein the method further comprises an ashing process comprising removing the one or more features while leaving a second portion of the material layer remaining.

10. The method of claim 1, wherein the silicon precursor comprises one or more of di(sec-butylamino)silane, neopentasilane, (dimethylamino)silane (DMAS), bis(ethylmethyl-amino)silane (BEMAS), tetrakis(dimethylamino)silane (TKDMAS), tetra(ethoxy)silane (TEOS, $Si(OC_2H_5)_4$), tris(tert-butoxy)silanol (TBOS), tris(tert-pentoxy)silanol (TP-SOL), and dimethyldichlorosilane ($Si(OC_2H_5)_4$, and $Si(CH_3)_2(OCH_3)_2$).

11. The method of claim 1, wherein the inert gas pulse period overlaps with the purge period and the plasma period.

12. The method of claim 1, wherein the one or more of the nitrogen reactant and the oxygen reactant comprises one or more of $N_2$, and NO.

13. The method of claim 1, wherein the reactant pulse period overlaps with the silicon precursor pulse period and the plasma period.

14. The method of claim 13, wherein a flowrate of the one or more of the nitrogen reactant and the oxygen reactant is reduced during the step of forming the plasma for the plasma period, relative to a flowrate of the one or more of the nitrogen reactant and the oxygen reactant prior to the step of forming the plasma.

15. The method of claim 9, wherein the substrate comprises a first layer overlying a bulk layer comprising a semiconductor material, wherein the one or more features are disposed on the first layer, wherein the second portion of the material layer is disposed on a first portion of the first layer, wherein the first layer comprises a second portion of the first layer with no second portion of the material layer disposed on it, and wherein the method further comprises removing the second portion of the material layer and the second portion of the first layer.

16. The method of claim 1, wherein a temperature of a susceptor during the step of forming a plasma is between about 250° C. and about 300° C.

17. The method of claim 1, wherein the inert gas comprises one or more of neon and xenon.

18. The method of claim 1, wherein a pressure within the reaction chamber during the step of forming is between about 1500 Pa and about 3000 Pa.

19. A device structure formed using the method of claim 15.

20. A system comprising:
a reaction chamber;
a silicon precursor source;
one or more of an oxygen reactant source and a nitrogen reactant source;
an inert gas source;
a flow control system;
a plasma power source;
an exhaust source; and
a controller,
wherein the controller is configured to control gas flow of a silicon precursor for a silicon precursor pulse, a nitrogen and/or oxygen reactant for a reactant pulse, and an inert gas for an inert gas pulse into the reaction chamber to form one or more of a silicon nitride layer and a silicon oxide layer on a surface of a substrate, wherein the controller is configured to:
provide the silicon precursor,
provide the nitrogen and/or oxygen reactant,
cease providing the silicon precursor,
after ceasing providing the silicon precursor, provide the inert gas,
after ceasing providing the silicon precursor, providing a plasma power,
cease providing the inert gas,
cease providing a plasma power,
after ceasing providing the inert gas, performing a purge,
wherein a plasma power is pulsed during a plasma pulse period,
wherein the nitrogen and/or oxygen reactant and the inert gas are provided to the reaction chamber for the plasma pulse period.

\* \* \* \* \*